(12) United States Patent
Mweene et al.

(10) Patent No.: US 11,063,589 B1
(45) Date of Patent: Jul. 13, 2021

(54) POWER CIRCUIT FACILITATING THE OPERATION OF A HIGH ELECTRON MOBILITY TRANSISTOR

(71) Applicant: GaN Force Corporation, HsinChu (TW)

(72) Inventors: Loveday Haachitaba Mweene, Wylie, TX (US); Tushar Heramb Dhayagude, Cupertino, CA (US)

(73) Assignee: GAN FORCE CORPORATION, Hsinchu (TW)

( * ) Notice: Subject to any disclaimer, the term of this patent is extended or adjusted under 35 U.S.C. 154(b) by 0 days.

(21) Appl. No.: 16/859,511

(22) Filed: Apr. 27, 2020

(51) Int. Cl.
*H02M 3/335* (2006.01)
*H03K 17/687* (2006.01)
*H03K 17/16* (2006.01)

(52) U.S. Cl.
CPC .................................. *H03K 17/687* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,055,722 A | * | 10/1991 | Latos | H03K 17/162 327/379 |
| 8,300,432 B2 | * | 10/2012 | Appelberg | H02M 3/33592 363/21.14 |
| 8,395,422 B2 | * | 3/2013 | Ogawa | H03K 17/08122 327/109 |
| 9,543,841 B2 | * | 1/2017 | Boulharts | H03K 17/102 |
| 9,685,857 B2 | * | 6/2017 | Barauna | H02M 5/458 |
| 10,263,538 B2 | * | 4/2019 | Ikeda | H03K 17/162 |
| 10,686,361 B2 | * | 6/2020 | Iorio | H02M 3/3376 |

\* cited by examiner

*Primary Examiner* — An T Luu
(74) *Attorney, Agent, or Firm* — Amin, Turocy & Watson, LLP

(57) ABSTRACT

One or more embodiments of a power circuit can comprise a capacitor in series between a power source and a gate of a transistor, to receive a driver output of a first voltage from the power source. The power circuit can further comprise a first diode in parallel between the power source and the gate of the transistor. In some embodiments, when the driver output is present and exceeds a first breakdown voltage of a second diode, and the second diode enables flow of current from the first cathode to the ground, resulting in the capacitor being negatively charged up to a second voltage corresponding to excess of the first voltage over the first breakdown voltage. In additional embodiments, after the capacitor is at least partially charged, when the driver output is not present, the capacitor discharges a negative current based on the negative charging of the capacitor up to the second voltage.

20 Claims, 8 Drawing Sheets

800 ⟶

802

CONFIGURING A CAPACITOR IN SERIES BETWEEN A POWER SOURCE AND A GATE OF A HIGH ELECTRON MOBILITY TRANSISTOR, TO RECEIVE A DRIVER OUTPUT OF A FIRST VOLTAGE FROM THE POWER SOURCE

804

CONFIGURING A FIRST DIODE IN PARALLEL BETWEEN THE POWER SOURCE AND THE GATE OF THE TRANSISTOR, WHEREIN THE CATHODE OF THE FIRST DIODE IS CONFIGURED TO BE COUPLED TO THE GATE OF THE TRANSISTOR, AND WHEREIN THE ANODE OF THE FIRST DIODE IS CONFIGURED TO BE COUPLED TO THE POWER SOURCE

806

WHEN THE DRIVER OUTPUT IS PRESENT AND EXCEEDS A FIRST BREAKDOWN VOLTAGE OF A SECOND DIODE, ENABLING BY THE SECOND DIODE, FLOW OF CURRENT FROM THE FIRST CATHODE TO THE GROUND, RESULTING IN THE CAPACITOR BEING NEGATIVELY CHARGED UP TO A SECOND VOLTAGE CORRESPONDING TO EXCESS OF THE FIRST VOLTAGE OVER THE FIRST BREAKDOWN VOLTAGE

808

AFTER THE CAPACITOR IS AT LEAST PARTIALLY CHARGED, WHEN THE DRIVER OUTPUT IS NOT PRESENT, DISCHARGING A NEGATIVE CURRENT FROM THE CAPACITOR BASED ON THE NEGATIVE CHARGING OF THE CAPACITOR UP TO THE SECOND VOLTAGE, WHEREIN THE DISCHARGED NEGATIVE CURRENT OFFSETS VOLTAGE AT THE GATE OF THE HIGH ELECTRON MOBILITY TRANSISTOR

FIG. 8

POWER CIRCUIT FACILITATING THE OPERATION OF A HIGH ELECTRON MOBILITY TRANSISTOR

TECHNICAL FIELD

This disclosure generally relates to embodiments for a power circuit device, and more particularly to power circuit for a high electron mobility transistor (HEMT) component.

BACKGROUND

Different types of electrical components can receive signals of different voltages that provide instructions to the components. Transistors are an example type of component that can receive signals of different voltages at a gate, with voltages above a threshold value causing the transistor to change a state, e.g., from non-conductive to conductive for enhanced mode transistors and from conductive to non-conductive for depletion transistors. Different transistors have different threshold voltages, as well as maximum voltages that can be received by the transistor without impairing function of the transistor.

Problems can occur when transistors are placed in circuits where gate voltages could exceed the maximum voltage for the transistor. One type of transistor that can have these problems is the high electron mobility transistor. In some circumstances, high electron mobility transistors can have lower threshold voltages, with this characteristic providing advantages in low-power operation over transistors with higher threshold values.

In some circumstances where lower-power consumption is sought, it could be advantageous to replace a higher threshold transistor with a high electron mobility transistor, but the gate signals for the transistor to be replaced may be at higher voltages that can inhibit the replacement without significant changes.

SUMMARY

The following presents a simplified summary of one or more of the embodiments of the present invention, in order to provide a basic understanding of the embodiments. This summary is not an extensive overview of the embodiments described herein, e.g., it is intended to neither identify key or critical elements of the embodiments nor delineate any scope of embodiments or the claims. A purpose of this summary is to present some concepts of the embodiments in a simplified form as a prelude to the more detailed description that is presented later. It will also be appreciated that the detailed description may include additional or alternative embodiments beyond those described in the Summary section.

Some of the disclosed systems and methods provide for a power circuit, comprising a capacitor in series between a power source and a gate of a transistor, to receive a driver output of a first voltage from the power source. The power circuit can further comprise a first diode in parallel between the power source and the gate of the transistor. In some embodiments, when the driver output is present and exceeds a first breakdown voltage, the first diode enables flow of current from the first cathode to the ground, resulting in the capacitor being negatively charged up to a second voltage corresponding to excess of the first voltage over the first breakdown voltage. In additional embodiments, after the capacitor is at least partially charged, when the driver output is not present, the capacitor discharges a negative current based on the negative charging of the capacitor up to the second voltage.

In other embodiments, a method of fabricating a power circuit is provided, the method comprising configuring a second Schottky diode in parallel with the capacitor. In embodiments, the method can further comprise configuring a first resistor in series between the third diode and the gate of the transistor, with the second Schottky diode being further configured in series between the power source and first resistor. Further, the first resistor can further be configured in parallel with the capacitor, with the first resistor facilitating, when the driver output is present, operation of the Zener diode by maintaining an enabling current provided to the Zener diode.

BRIEF DESCRIPTION OF THE DRAWINGS

Non-limiting embodiments of the subject disclosure are described with reference to the following figures, wherein like reference numerals refer to like parts throughout the various views unless otherwise specified:

FIG. 8 illustrates an example flow diagram for a method that can facilitate fabrication of a power circuit, in accordance with one or more embodiments.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Reference throughout this specification to "one embodiment," "an embodiment," or "one or more embodiments"

can be an indication that a particular feature, structure, or characteristic described in connection with the embodiment is included in at least one embodiment. Thus, the appearances of the phrase "in one embodiment," "in an embodiment," and "in one or more embodiments" in various places throughout this specification are not necessarily all referring to the same embodiment. Furthermore, the particular features, structures, or characteristics may be combined in any suitable manner in one or more embodiments.

Figure 1A:
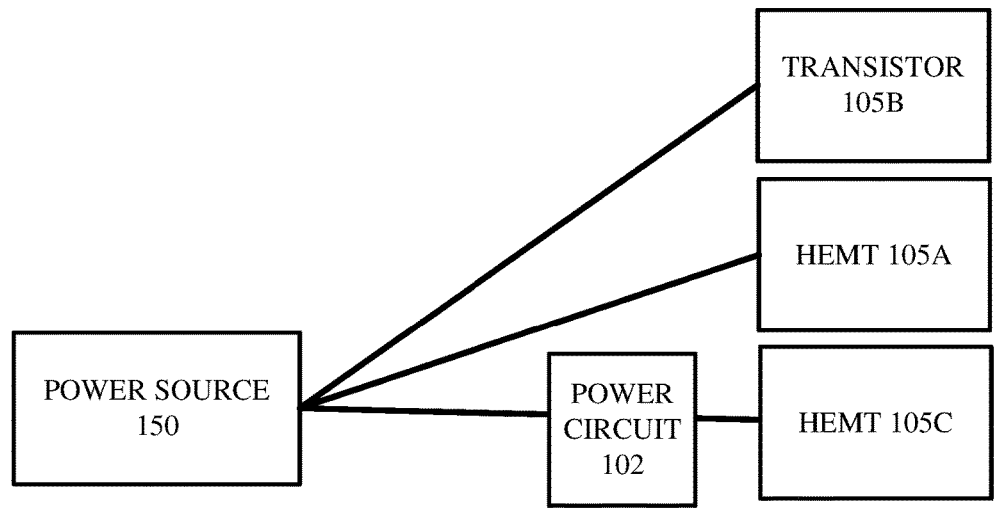
FIG. 1A depicts a non-limiting example system for providing power to different transistors, in accordance with one or more embodiments.

FIG. 1A depicts a non-limiting example system 100 for providing power to different transistors, in accordance with one or more embodiments. For purposes of brevity, description of some elements and/or processes of embodiments discussed further below are omitted in this discussion of FIG. 1. System 100 can include power source 150, and transistors 105A-C, these respectively being HEMT 105A, field effect transistor (FET) 105B, and HEMT 105C. As discussed further below, HEMT is coupled to power source 150 via system 102, this system being described by combinations of one or more embodiments described herein. Example embodiments of power circuit 102 are discussed with FIGS. 2-9 below.

Figure 1B:
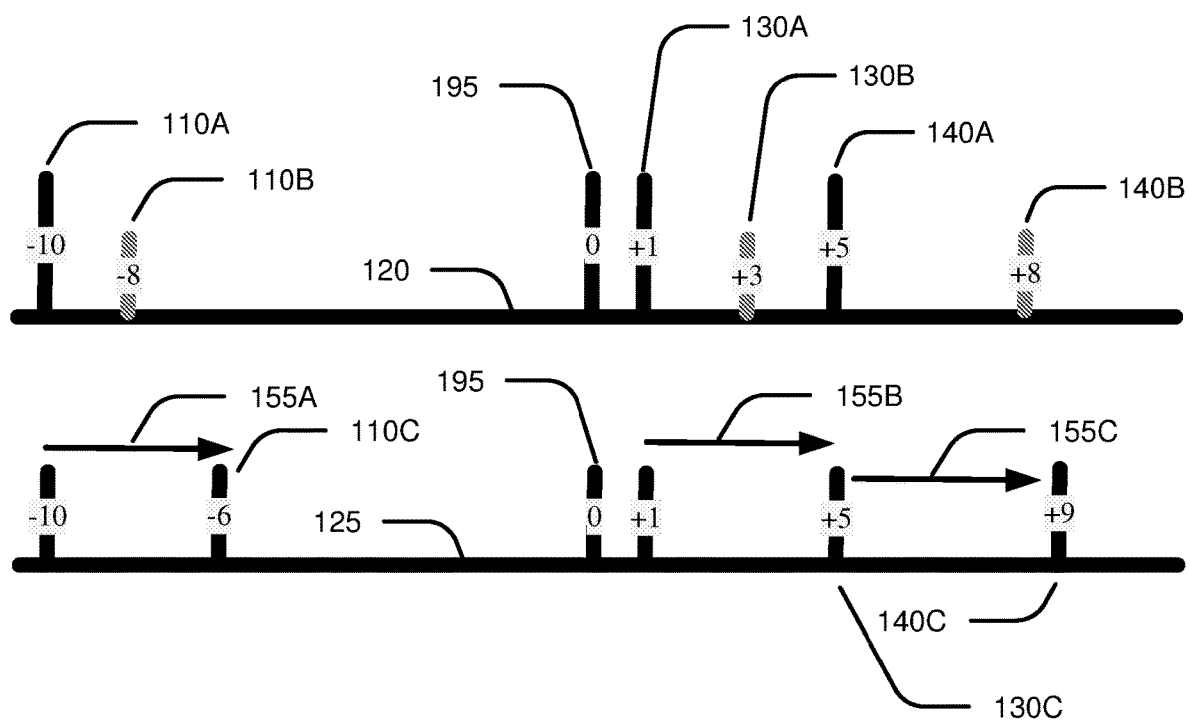
FIG. 1B depicts example ranges of voltages that can be applied to respective gates of transistors to facilitate operation of the components, in accordance with one or more embodiments.

FIG. 1B depicts example ranges of voltages that can be applied to respective gates of transistors 105A-C to facilitate operation of the components, in accordance with one or more embodiments. For purposes of brevity, description of some elements and/or processes of embodiments discussed further below are omitted.

On illustrative number line 120, example ranges of voltages for HEMT 105A and FET 105B are depicted, and on number line 125, example ranges of voltages for HEMT 105C are depicted. Number line 120 depicts for transistors 105A-B respectively, threshold voltages 130A-B, maximum voltages 140A-B, and maximum negative voltages 110A-B, and zero point 195. Number line 125 depicts previous voltages for 110A, 130A, and 140A, for HEMT 105A from number line 120, and also respective shifts 155A-C for these voltages to 110C, 130C, and 140C, based on the operation of system 102, in accordance with one or more embodiments.

The voltages for transistor 105B are provided to illustrate the type of transistor for which power source 150 was configured. As is illustrated by the voltages for HEMT 105A, without modification, the voltages for transistor 105B will likely impair or damage HEMT 105A. To address this problem one or more embodiments can facilitate the shifts 155A-C in the voltages specified by HEMT 105C.

Figure 2:
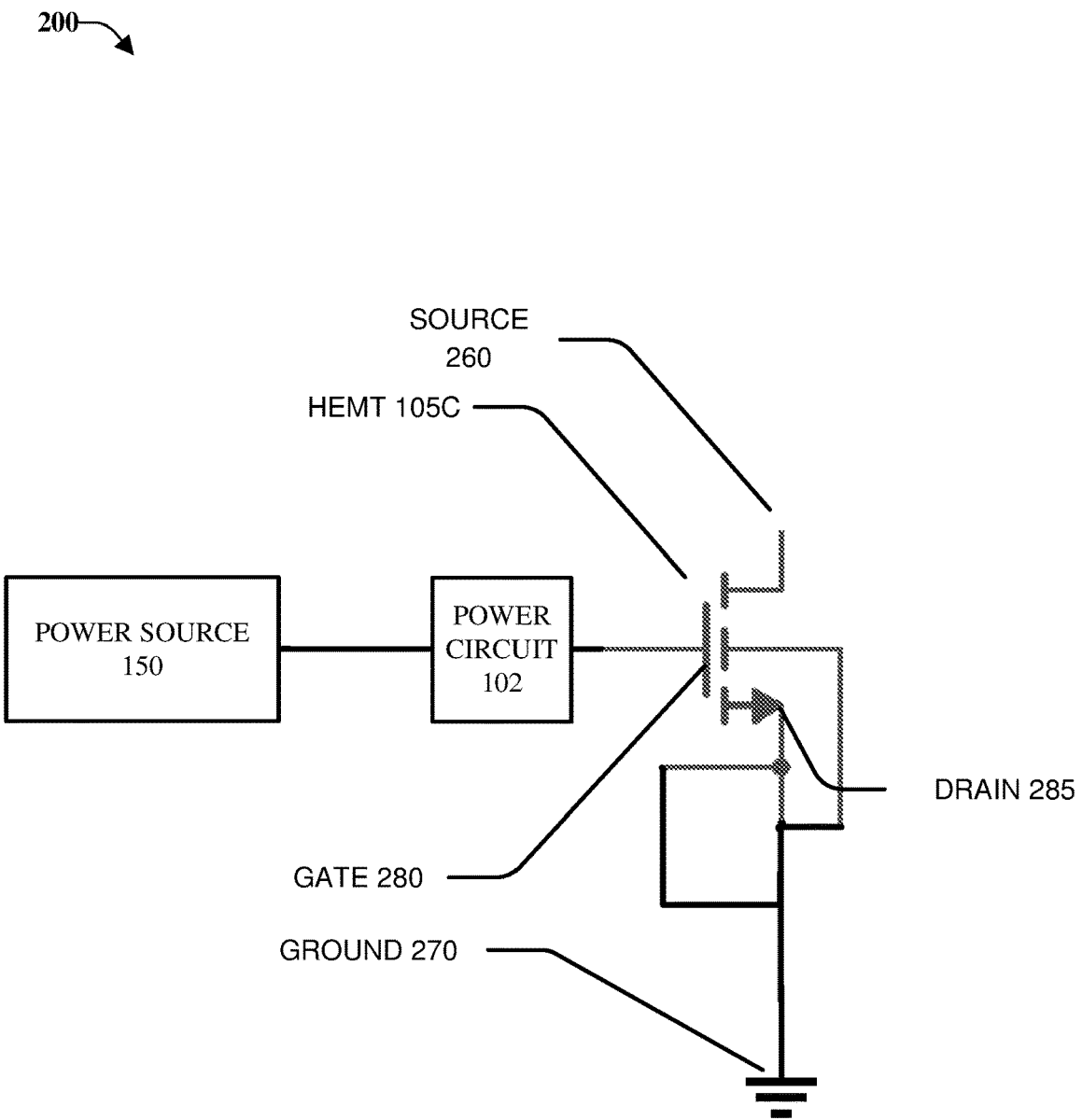
FIG. 2 depicts an example, simplified circuit diagram for the system of FIG. 1, in accordance with one or more embodiments.

FIG. 2 depicts an example, simplified circuit diagram 200 for system 100 of FIG. 1, in accordance with one or more embodiments. For purposes of brevity, description of some elements and/or processes of embodiments discussed further below are omitted. In accordance with one or more embodiments, circuit diagram 200 depicts power source 150, power circuit 102, and HEMT 105C, which includes source input 260, drain 285, gate 280, and ground 270.

In the example of FIG. 2, basic components are illustrated that can be utilized by one or more embodiments. It is important to note that, while HEMT 105C is depicted, it is not necessarily true that power supply 150 is configured to produce signals with voltages that can be handled by HEMT 105C. As discussed further below, power circuit 102 can use different approaches to facilitate the use of power source 150, even if the source was designed for a different type of transistor.

Figure 3:
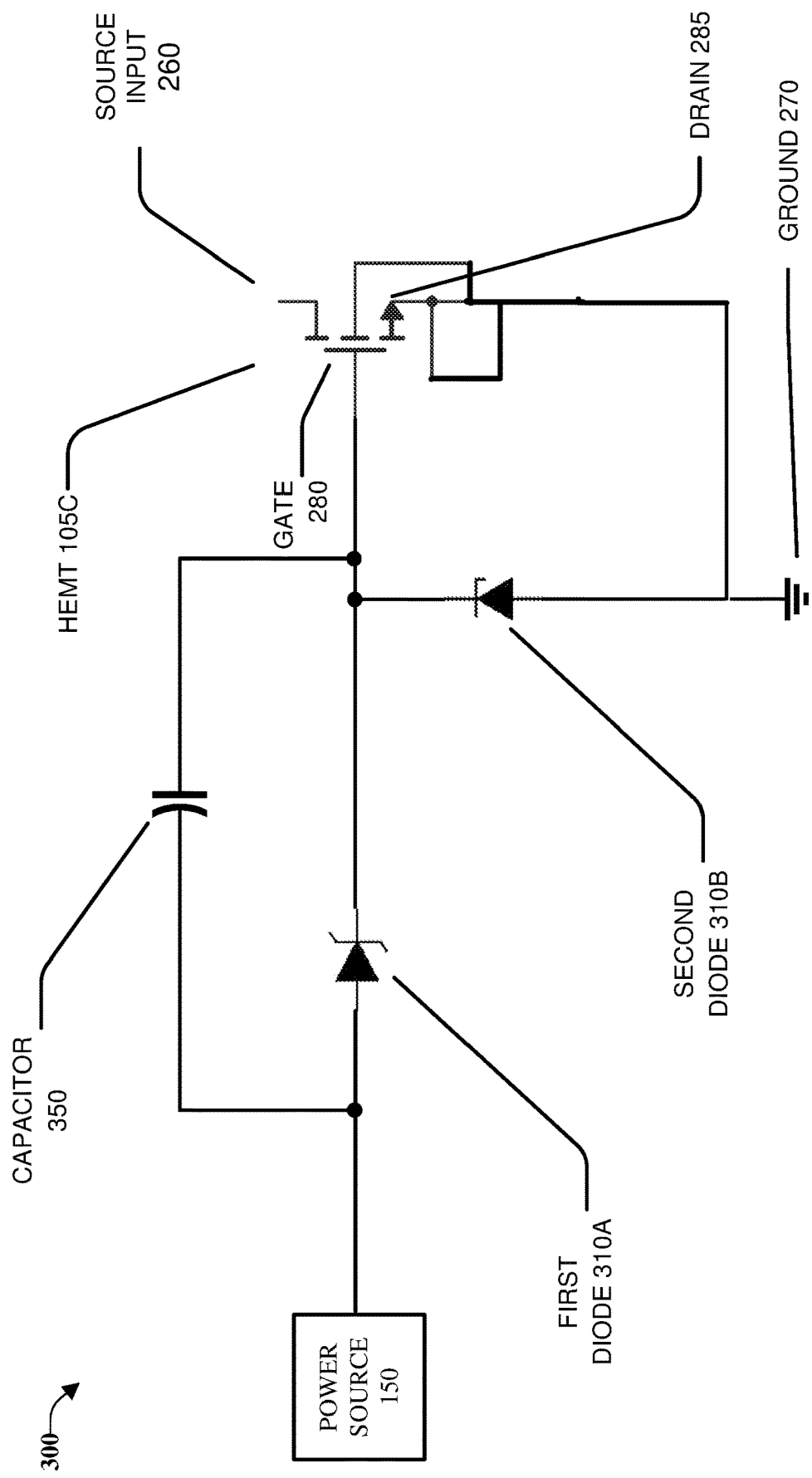
FIG. 3 depicts a more detailed circuit diagram of example embodiments of system 200 described above, in accordance with one or more embodiments.

FIG. 3 depicts a more detailed circuit diagram 300 of example embodiments of system 200 described above, in accordance with one or more embodiments. For purposes of brevity, description of some elements and/or processes of embodiments discussed further below are omitted.

Circuit diagram 300 depicts, capacitor 350 configured in series between power source 150 and gate 280 of HEMT 105C, to receive a driver output of a first voltage from power source 150, in accordance with one or more embodiments. Circuit diagram 300 further depicts a first diode 310A configured in parallel with the capacitor 350 and between power source 150 and gate 280 of HEMT 105C, wherein the cathode of first diode 310A is coupled to gate 280 of HEMT 105C, and the anode of first diode 310A is coupled to power source 150. First diode 310A is depicted in FIG. 3 as configured in series between power source 150 and gate 280 of HEMT 105C, and also in parallel with capacitor 350, in accordance with one or more embodiments.

In one or more embodiments, when driver output from power source 150 is present and exceeds a first breakdown voltage of second diode 310B, second diode 310B can enable flow of current from the first cathode of first diode 310A to ground 270. In one or more embodiments, the respective placement of first diode 310A in parallel with the capacitor 350 and between the power source and gate 280 of HEMT 105C can, when the driver output from power source 150 is present and exceeds the first breakdown voltage, result in capacitor 350 being negatively charged up to a second voltage corresponding to excess of the first voltage over the first breakdown voltage.

In an example implementation, and power source 150 provides 10V of driver output for gate 280 of HEMT 105C, which has a maximum voltage level of 5V. For this circuit, to facilitate the use of power source 150 by HEMT 105C, second diode 310B is implemented as a Zener diode h-voltage of 4V. Based on this example, the excess 6V (e.g., 10V direct output minus the breakdown voltage of 4V) will be balanced out by negatively charging capacitor 350 beginning as the 10V is applied to the power circuit, and ending when capacitor 350 is negatively charged up to 6V. In this example, the clamping of voltage to gate 280 to 4V by second diode 310B results in a beneficial prevention of the voltage at gate 280 exceeding the maximum 5V voltage for HEMT 105C. Additional benefits associated with the negative charging of capacitor 350 are discussed with FIG. 4 below.

Figure 4:
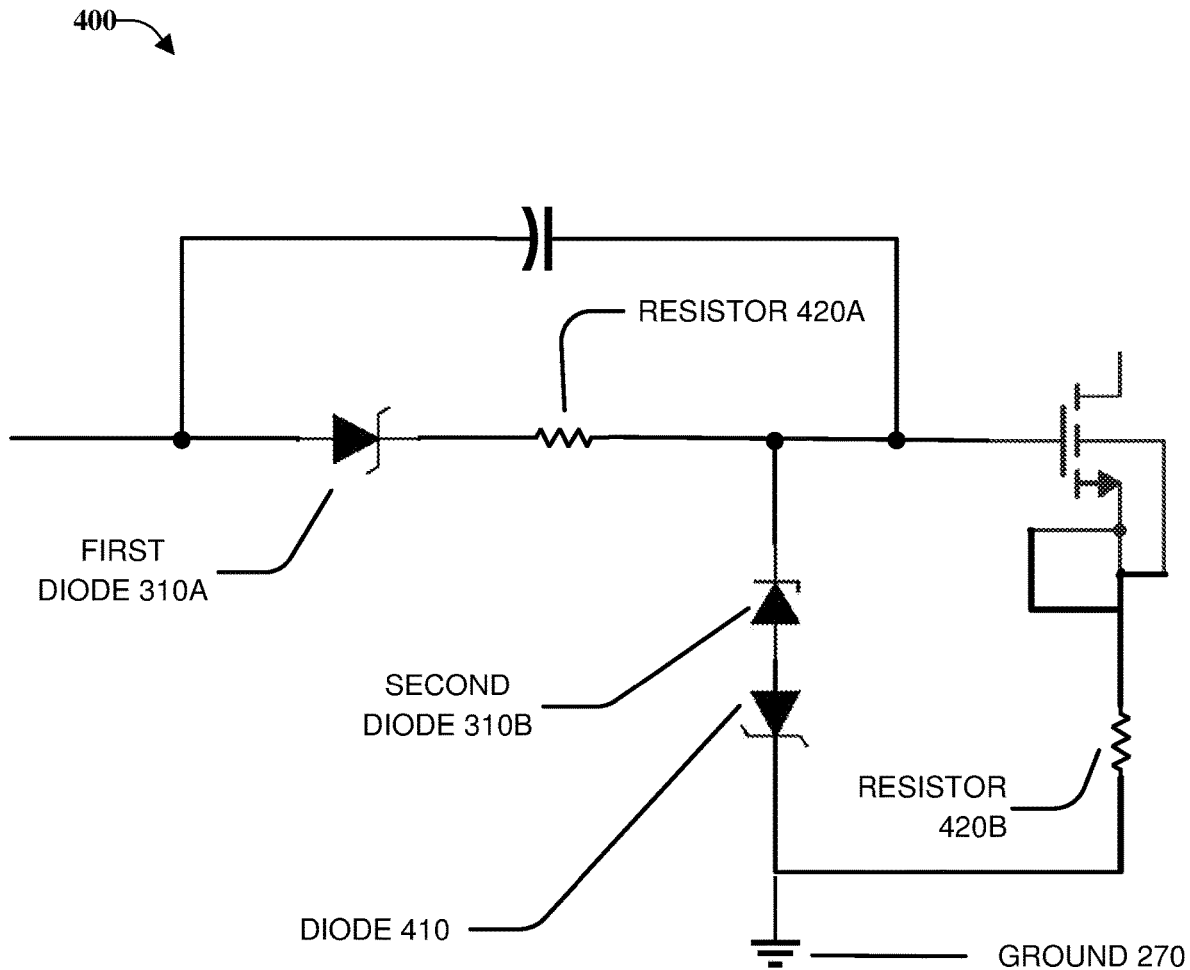
FIG. 4 depicts a more detailed circuit diagram of example embodiments of systems 200 and 300 described above, in accordance with one or more embodiments.

FIG. 4 depicts a more detailed circuit diagram 400 of example embodiments of systems 200 and 300 described above, in accordance with one or more embodiments. For purposes of brevity, description of some elements and/or processes of embodiments discussed further below are omitted. FIG. 4 depicts the power circuit of FIG. 3 as described above, with the addition of resistors 420A-B, described below, and diode 410.

In one or more embodiments, diode 410 is configured in serial between the second diode 310B and drain 285 of the HEMT 105C, and is further configured to be in parallel with diode 310A between the power source and gate 280 of HEMT 105C. A cathode of diode 410 is coupled to drain 285 of the HEMT 105C and ground 270.

As noted above with FIGS. 1A-1B, to solve some problems associated with power provided to gate 280 being above a maximum voltage, one or more embodiments can use negative voltage to shift 155C maximum voltage up from the 5V maximum, e.g., to 9V as depicted in FIG. 1B. To implement this shift, in one or more embodiments, when capacitor 350 is at least partially charged, and when the driver output is not present from power source 150, the absence of incoming voltage to capacitor 350 can cause capacitor 350 to discharge a negative current based on the negative charging of the capacitor up to the second voltage, e.g., up to 6V in the example described above.

In one or more embodiments, several aspects of the depicted power circuit are implemented to facilitate the negative voltage applied to gate 280. For example, returning to diode 310B, this diode, by its placement in parallel with capacitor 350, can be used to block the transmission of the negative voltage towards power source 150. One way this can be accomplished is to implement a diode with a high enough reverse breakdown voltage to prevent the negative voltage to be propagated, while allowing the gate voltage from power source 150 to be propagated to gate 280.

As depicted in FIG. 4, diode 410 is configured to be in serial between gate 280 and second diode 310B, with a cathode of diode 410 positioned so as to block negative current from ground 270 from reaching the parallel circuit through the anode of second diode 310B. In one or more embodiments, this blocking of negative current can be useful in facilitating the use of the negative charge to offset voltage to gate 280, as described above.

In one or more embodiments, as depicted in FIG. 4, first diode 310A can be a Schottky diode with an example negative breakdown value of 30V. Characteristics of Schottky diodes that would be appreciated by one having skill in the relevant art(s), given the description herein include the low voltage drop caused by Schottky diodes as compared to Zener diodes, e.g., as discussed with resistor 420A below, to operate accurately, diode 310A, in this example a Zener diode, may require a certain minimum level of current to be applied. As implemented by one or more embodiments, the low voltage drop across the cathode of first diode 310A (e.g., Schottky diode) from power source 150 can help to maintain a requisite level of current. Another example characteristic of Schottky diodes that can facilitate one or more embodiments described herein is the rapid switching capability of Schottky diodes as compared to Zener diodes. In this example, because example Schottky first diode 310A can rapidly switch, propagation of negative voltage discharge outside the power circuit can be prevented.

Expanding on this diode accuracy benefit from one or more embodiments, in some instances of second diode 310B, where second diode 310B is a Zener diode, with a relatively small breakdown voltage specification (e.g., 5.6V or less), depending on the current applied, the breakdown voltage used for purposes including the clamping of the voltage to gate 280 based on the breakdown voltage of second diode 310B, can be inconsistent. In addition, because, in some circumstances, the actual breakdown voltage of second diode 310B can be different than the rating of second diode 310B. One approach taken by one or more embodiment to provide more stable current to second diode 310B (thus making the breakdown value more predictable) is to configure resistor 420A in serial between first diode 310A and gate 280. In an example, resistor 420A can have a 0.330 ohms resistance, and this value can increase the current of the 10V example driver output over a current level that second diode 310B can require for accuracy. Thus, in one or more embodiments, resistor 420A can facilitate, when the driver output is present, operation of second diode 310B by maintaining an enabling current level is provided to the second diode 310B. In one or more embodiments, resistor 420B can configured in serial between ground 270 and drain 285 of HEMT 105C.

Figure 5:
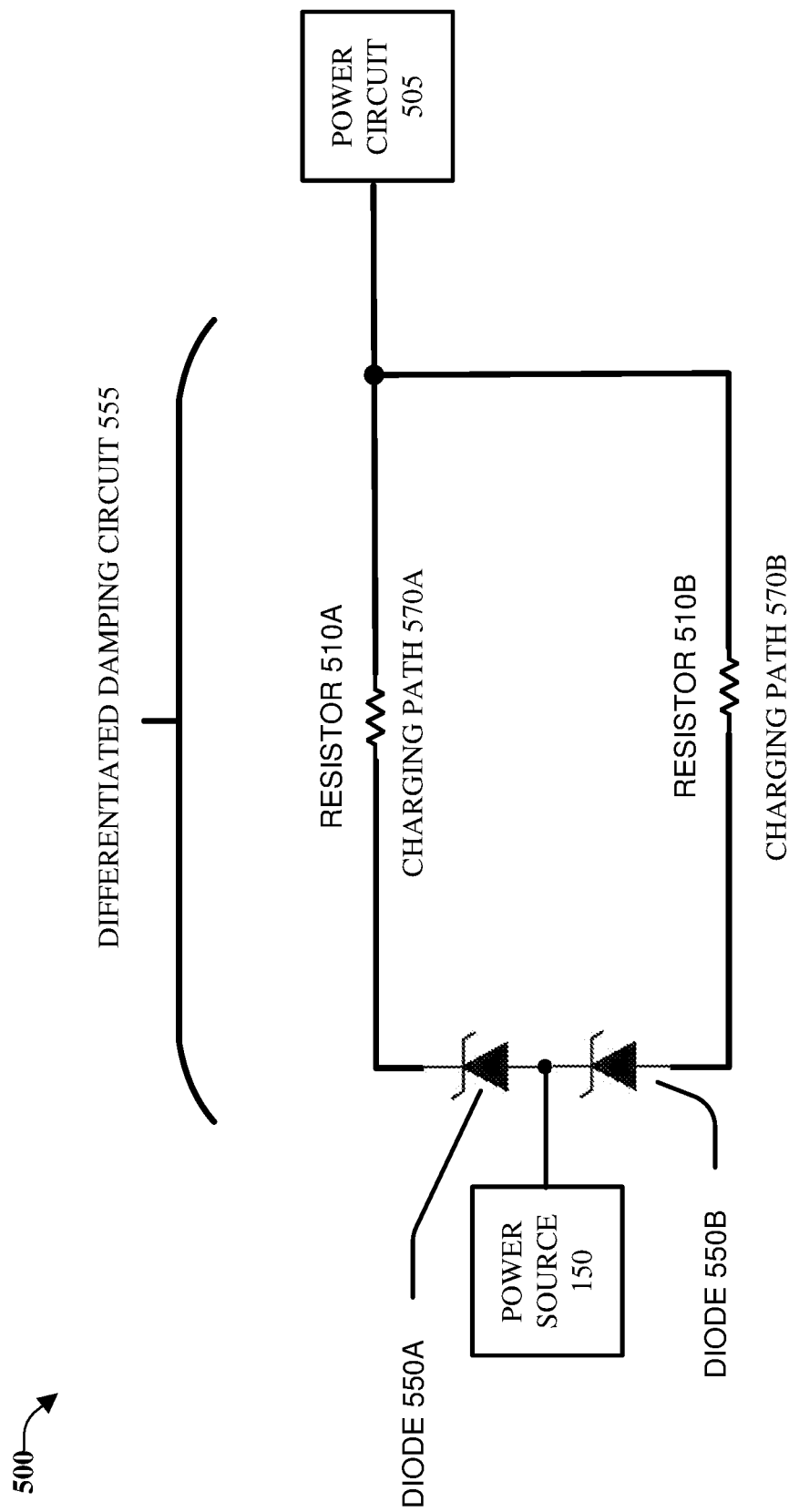
FIG. 5 depicts a non-limiting example system that can provide damping for both positive and negative current operations of power circuit of FIG. 4, in accordance with one or more embodiments.

FIG. 5 depicts a non-limiting example system 500 that can provide damping for both positive and negative current operations of power circuit 505, in accordance with one or more embodiments. For purposes of brevity, description of some elements and/or processes of embodiments discussed further below are omitted.

System 500 can include power source 150, differentiated damping circuit 555, and power circuit 505. Differentiated damping circuit 555 can include two circuit paths in parallel with each other that can facilitate differential damping of positive and negative current. With respect to the other component of system 500, differentiated damping circuit 555 is configured in series between power source 150 and power circuit 505, e.g., coupled to an anode of diode 550A. Broadly, in one or more embodiments, when the driver output is present from power source 150, differentiated damping circuit 555 can utilize a charging resistance on a charging path 570A between the power source and the third diode. In an alternative situation, when the driver output is not present from power source 150, differentiated damping circuit 555 can utilize a discharging resistance on a discharging path 570B between power source 150 and power circuit 505, in accordance with one or more embodiments. Embodiments of charging and discharging resistance are described after some general examples discussed below.

In one or more embodiments of differentiated damping circuit 555 described above, as depicted, the charging path can comprise resistor 510A to provide the charging resistance in charging path 570A, and a diode 550A (e.g., a Schottky diode in this example) is configured in series between power source 150 and resistor 510A. In additional embodiments of differentiated damping circuit 555 described above, discharging path 570B can comprise resistor 510B to provide the discharging resistance in discharging path 570B, and a diode 550B (e.g., also a Schottky diode in this example) is configured in series between power source 150 and resistor 510B, with a cathode of diode 550B coupled to power source 150. It should be noted that Schottky diodes 550A-B, based on their cathode orientation can respectively, allow positive voltage to follow charging path 570A while preventing negative voltage less than a breakdown voltage of diode 550A from passing toward power source 150, and prevent positive voltage less than a breakdown voltage of diode 550B from following discharging path 570B while allowing negative voltage to pass towards power source 150. Example Schottky diodes 550A-B include breakdown voltages of 50V, e.g., D14 BAT54S diodes.

As would be appreciated by one or more embodiments, damping circuits can act to reduce ringing interference caused by resistance and induction in power circuit 505, that is, natural resonance of a circuit that can be termed decaying sinusoidal oscillations. In one or more embodiments, resistances can be selected to mitigate ringing in both positive current from power source 150, and negative current from capacitor 350 when positive current is not being received from power source 150. An example resistor that can be selected for embodiments to mitigate ringing on charging path 570A is a 1K Ohm resistor (R24 20), and an example resistor that can be selected for embodiments to mitigate ringing on discharging path 570B is a 2.7K Ohm resistor (R24 20), but it should be noted that these examples are non-limiting, and different combinations of resistances can be selected for different implementations of embodiments.

Figure 6:
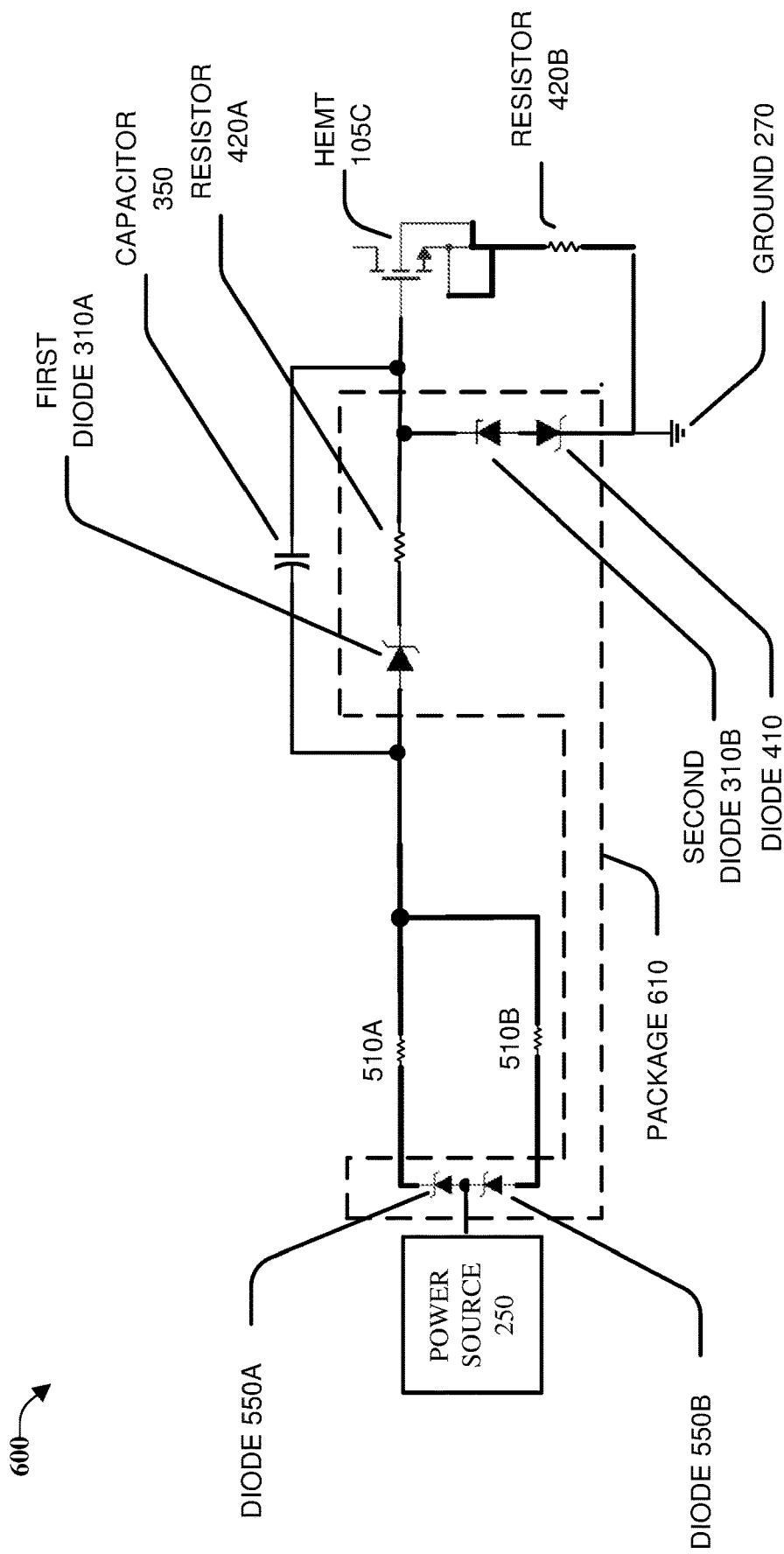
FIG. 6 depicts non-limiting example system with circuits of FIGS. 4 and 5 linked together, with some components being integrated into a package and some components not being integrated into the package, in accordance with one or more embodiments.

FIG. 6 depicts non-limiting example system 600 with circuits of FIGS. 4 and 5 linked together, with some components being integrated into package 610 and some components not being integrated in to package 610, in accordance with one or more embodiments. For purposes of brevity, description of some elements and/or processes of embodiments discussed further below are omitted. System 600 includes components described herein in an example configuration shown in FIG. 6, including, but not limited to, diodes 310A-B, 550A-B, and 410, resistors 420A-B and 510A-B, capacitor 350, and HEMT 250.

In one or more embodiments package 610 can be generated by different approaches to integrating circuit components, including an integrated circuit (IC). As noted above, some of the components listed above can be selected for inclusion in package 610, and some component can be coupled to I/O of package 610 to effect creation of circuits similar to system 600. In the non-limiting example depicted, package 610 can include, but is not limited to diodes 310A-B, 550A-B, and 410, and resistor 420A. In one or more embodiments, the selection of different components can be based on different considerations, such as a need to implement different types of a particular component for different implementations.

For example, because, as would be appreciated by one having skill in the relevant art(s), given the description herein, characteristics of capacitor 350 (e.g., nominal capacitance (C)) can affect how long capacitor 350 can generate negative offset voltage for HEMT 105C, e.g., because capacitor 350 can only discharge negative voltage that has been stored in available charging capacity and when the capacity is smaller, the time of discharge is less. Thus, based on the foregoing, in the example depicted in FIG. 6, capacitor 350 is not included in package 610. One having skill in the relevant art(s), given the description herein, would appreciate additional reasons for including or excluding components from package 160. In another example, resistors 510A-B are excluded from package 610 to facilitate, as described with FIG. 5 above, the selection of different resistances for mitigating ringing in the power system.

Figure 7:
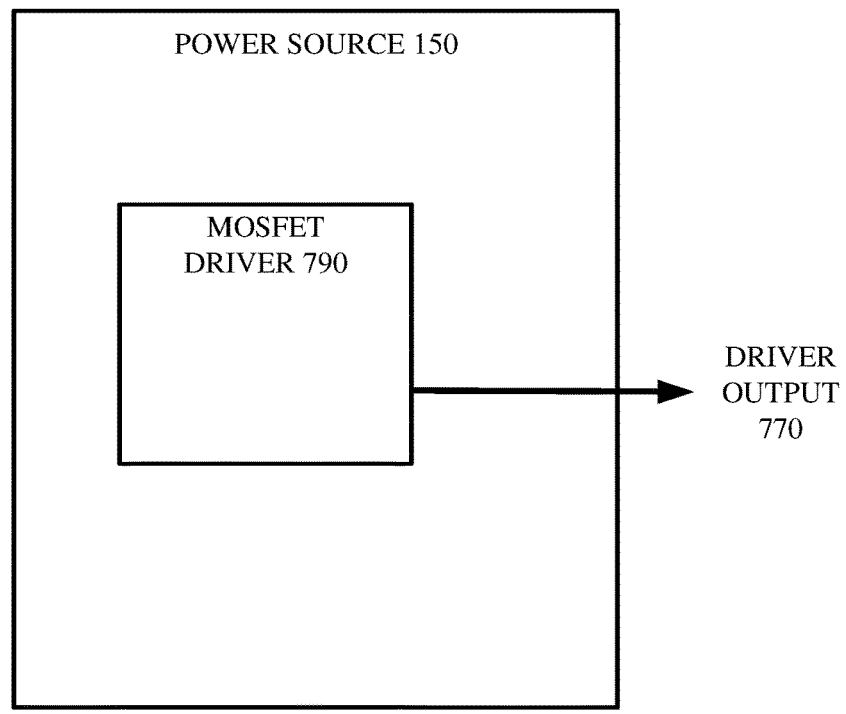
FIG. 7 depicts an example system with a configuration of a power source that can illustrate some beneficial characteristics of one or more embodiments.

FIG. 7 depicts an example system 700 with a configuration of power source 150 that can illustrate some beneficial characteristics of one or more embodiments. For purposes of brevity, description of some elements and/or processes of embodiments discussed further below are omitted. System 700 can include power source 150, with metal-oxide-semiconductor FET (MOSFET) driver 790.

As described above, one or more embodiments can reduce driver outputs 770 that exceed the relatively low maximum gate voltage of HEMT 105C. It should be noted that, instead of utilizing an additional power source to generate negative offset voltage, as described above, one or more embodiments can utilize incoming driver output 770 to charge capacitor 350 that can offset subsequent driver output 770. Based on these characteristics, as well as other characteristics described or suggested herein, one or more embodiments can be used to implement HEMT 105C using a power source that was designed to support the example transistor 105B discussed with FIG. 1, e.g., higher voltage maximum, different driver, etc.).

In the example depicted in FIG. 8, MOSFET driver 790 generates driver output 770 voltage that is typical for such a component, e.g., 8V discussed with FIG. 1B above. For this example, FIGS. 1B and 4, along with associated descriptions, described how one or more embodiments can offset the 8V driver output 770 to be within acceptable ranges for HEMT 105C.

In a variation of this example, MOSFET driver 790 can be high enough (e.g., 16V) so as to potentially exceed the capacity of the offset voltage described herein, e.g., 4V negative voltage applied only reduces voltage to 12V. In this example, to further reduce the incoming voltage, as the voltage is received by the circuits depicted in FIGS. 5 and 6, a 7V Zener diode can be applied to reduce the voltage down to 9V (not shown). Having reduced the incoming voltage down to 9V, the offset approaches described above (e.g., 4V) can be used to further reduce the voltage at gate 280 to 5V.

FIG. 8 illustrates an example flow diagram for a method 800 that can facilitate fabrication of a power circuit, in accordance with one or more embodiments. For purposes of brevity, description of like elements and/or processes employed in other embodiments is omitted.

In this example, method 800 of fabricating a power circuit is provided, the method comprising 802-806 described below. At 802, the method can comprise configuring a capacitor in series between a power source and a gate of a high electron mobility transistor, wherein the capacitor is configured to receive a driver output of a first voltage from the power source At 804, the method can comprise configuring a first diode (e.g., a Zener diode) in parallel with the capacitor and between the power source and the gate of the transistor, with the cathode of the first diode being configured to be coupled to the gate of the transistor, and with the anode of the first diode being configured to be coupled to the power source.

At 806, the method can comprise, when the driver output is present and exceeds a first breakdown voltage of a second diode, enabling by the second diode (e.g., a Zener diode), flow of current from the first cathode to the ground, resulting in the capacitor being negatively charged up to a second voltage corresponding to excess of the first voltage over the first breakdown voltage.

At 808, the method can comprise, after the capacitor is at least partially charged, when the driver output is not present, discharging a negative current from the capacitor based on the negative charging of the capacitor up to the second voltage, wherein the discharged negative current offsets voltage at the gate of the high electron mobility transistor.

While the various embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope of the various embodiments. Moreover, while the various embodiments are susceptible to various modifications and alternative constructions, certain illustrated implementations thereof are shown in the drawings and have been described above in detail. It should be further understood, however, that there is no intention to limit the various embodiments to the specific forms disclosed, but on the contrary, the intention is to cover all modifications, alternative constructions, and equivalents falling within the spirit and scope of the various embodiments.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A power circuit, comprising:
   a capacitor configured in series between a power source and a gate of a transistor, to receive a driver output of a first voltage from the power source; and
   a first diode configured in parallel with the capacitor and between the power source and the gate of the transistor, wherein a first cathode of the first diode is coupled to the gate of the transistor, and wherein a first anode of the first diode is coupled to the power source, wherein:
   when the driver output is present and exceeds a first breakdown voltage of a second diode, the second diode enables flow of current from the first cathode to a ground, resulting in the capacitor being negatively charged up to a second voltage corresponding to excess of the first voltage over the first breakdown voltage, and
   after the capacitor is at least partially charged, when the driver output is not present, the capacitor discharges a negative current based on the negative charging of the capacitor up to the second voltage.

2. The power circuit of claim 1, wherein the transistor comprises a gallium nitride high electron mobility transistor.

3. The power circuit of claim 1, wherein the transistor is configured to be in an off state when a voltage lower than a threshold voltage of the transistor is applied to the gate of the transistor.

4. The power circuit of claim 1, wherein a negative voltage of the negative current comprises an offset voltage for the gate of the transistor.

5. The power circuit of claim 1, wherein, based on the second diode only allowing current to flow from the first cathode to the ground when the first voltage exceeds the first breakdown voltage, the second diode restricts to the first breakdown voltage, the first voltage reaching the gate of the transistor.

6. The power circuit of claim 5, wherein the first breakdown voltage is lower than a maximum gate voltage of the transistor.

7. The power circuit of claim 4, further comprising a third diode configured in serial between the second diode and the drain of the transistor, wherein a second cathode of the third diode is coupled to the drain of the transistor and the ground, and wherein to facilitate the offset voltage, the third diode allows negative current to flow from the third diode to the second diode when the negative voltage exceeds a second breakdown voltage of the third diode.

8. The power circuit of claim 7, wherein the third diode comprises a Schottky diode.

9. The power circuit of claim 7, further comprising:
   a first resistor configured in series between the first diode and the gate of the transistor, the first diode and the first resistor being further configured in parallel with the capacitor, and wherein the first resistor facilitates, when the driver output is present, operation of the second diode by maintaining an enabling current provided to the second diode.

10. The power circuit of claim 9, wherein the first diode comprises a Schottky diode.

11. The power circuit of claim 9, further comprising a differentiated damping circuit configured in series between the power source and the first diode, wherein:
when the driver output is present, the differentiated damping circuit utilizes a charging resistance on a charging path between the power source and the first diode, and
when the driver output is not present, the differentiated damping circuit utilizes a discharging resistance on a discharging path between the first diode and the power source.

12. The power circuit of claim 11,
wherein the charging path comprises:
a second resistor to provide the charging resistance, and
a fourth diode configured in series between the power source and the second resistor, the second resistor being configured in series between the first diode and the fourth diode; and
wherein the discharging path comprises:
a third resistor to provide the discharging resistance, and
a fifth diode configured in series between the power source and the third resistor, the third resistor being configured in series between the first diode and the fifth diode.

13. The power circuit of claim 11, wherein the differentiated damping circuit is configured to reduce ringing interference caused by operation of the power circuit.

14. The power circuit of claim 1, wherein the second diode comprises a Zener diode, and wherein the first breakdown voltage is less than or equal to 5.6 volts.

15. A method of fabricating a power circuit, comprising:
configuring a capacitor in series between a power source and a gate of a high electron mobility transistor, to receive a driver output of a first voltage from the power source;
configuring a first diode in parallel with the capacitor and between the power source and the gate of the high electron mobility transistor, wherein a first cathode of the first diode is configured to be coupled to the gate of the high electron mobility transistor, and wherein a first anode of the first diode is configured to be coupled to the power source;
when the driver output is present and exceeds a first breakdown voltage of a second diode, enabling by the second diode, flow of current from the first cathode to the ground, resulting in the capacitor being negatively charged up to a second voltage corresponding to excess of the first voltage over the first breakdown voltage, and
after the capacitor is at least partially charged, when the driver output is not present, discharging a negative current from the capacitor based on the negative charging of the capacitor up to the second voltage, wherein the discharged negative current offsets voltage at the gate of the high electron mobility transistor.

16. The method of fabricating the power circuit of claim 15, further comprising configuring a first Schottky diode in serial between the second diode and the drain of the high electron mobility transistor, wherein a second cathode of the first Schottky diode is coupled to the drain of the high electron mobility transistor and the ground, and wherein to facilitate the offset voltage, the first Schottky diode allows negative current to flow from the second cathode to the second diode when the negative voltage exceeds a second breakdown voltage of the first Schottky diode.

17. The method of fabricating the power circuit of claim 16, wherein the second diode comprises a Zener diode, and wherein configuring of the Zener diode and the first Schottky diode comprises fabricating an integrated circuit comprising functions of the Zener Diode and the first Schottky diode, wherein the integrated circuit comprises signal pins to establish connections to the capacitor and the gate of the high electron mobility transistor.

18. The method of fabricating the power circuit of claim 15, wherein the high electron mobility transistor is configured to be in an off state when a voltage lower than a threshold voltage of the high electron mobility transistor is applied to the gate of the high electron mobility transistor.

19. The method of fabricating the power circuit of claim 15,
wherein the first diode comprises a second Schottky diode, and wherein the method further comprise configuring a first resistor in series between the second Schottky diode and the gate of the high electron mobility transistor, wherein the second Schottky diode is further configured in series between the power source and the first resistor, the first resistor being further configured in parallel with the capacitor, and wherein the first resistor facilitates, when the driver output is present, operation of the second diode by maintaining an enabling current provided to the second diode.

20. The method of fabricating the power circuit of claim 15, wherein the high electron mobility transistor comprises a gallium nitride high electron mobility transistor.

* * * * *